(12) United States Patent
Mortensen

(10) Patent No.: US 9,917,684 B1
(45) Date of Patent: Mar. 13, 2018

(54) SYSTEM AND METHOD FOR SAMPLED ANALOG CLOCK DISTRIBUTION

(71) Applicant: ANALOG DEVICES, INC., Norwood, MA (US)

(72) Inventor: Mikael Mortensen, Cambridge, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/296,980

(22) Filed: Oct. 18, 2016

(51) Int. Cl.
*H04L 7/00* (2006.01)

(52) U.S. Cl.
CPC .................................. *H04L 7/0037* (2013.01)

(58) Field of Classification Search
CPC ........................... H04L 7/0037; H03K 19/096; H03K 19/0966; G06F 1/08; G06F 9/3869; G11C 7/16
See application file for complete search history.

(56) References Cited

U.S. PATENT DOCUMENTS

| 3,571,584 | A | * | 3/1971 | Bolie | ..................... | G01R 17/00 |
| | | | | | | 708/8 |
| 5,434,520 | A | | 7/1995 | Yetter et al. | | |
| 6,288,589 | B1 | | 9/2001 | Potter et al. | | |
| 6,865,186 | B1 | * | 3/2005 | Jackson | ..................... | G11C 7/16 |
| | | | | | | 370/419 |
| 2009/0073021 | A1 | | 3/2009 | Lee et al. | | |
| 2009/0327385 | A1 | | 12/2009 | Groezing et al. | | |
| 2014/0062741 | A1 | * | 3/2014 | Nakanishi | ........... | H03M 1/0827 |
| | | | | | | 341/122 |

OTHER PUBLICATIONS

Simon Tam et al., "Clock generation and distribution for the 130-nm Itanium® 2 processor with 6-MB on-die L3 Cache", Published in: IEEE Journal of Solid-State Circuits (vol. 39, Issue: 4), pp. 636-642 (2004).

* cited by examiner

*Primary Examiner* — David S Huang
(74) *Attorney, Agent, or Firm* — Patent Capital Group

(57) ABSTRACT

Sampled analog data are transferred between sampled analog circuits operating on respective local phase clocks which are triggered by a master clock. In response to a first (DATA READY) signal from an upstream sampled analog circuit, the sampled analog data are transferred from an upstream sampled analog circuit to a data transfer circuit. In response to a second (READY FOR DATA) signal from a downstream sampled analog circuit, the sampled data are transferred from the data transfer circuit to the downstream sampled analog circuit. The sampled data are delayed in the data transfer circuit for at least one master clock cycle when the second signal from the downstream sampled analog circuit is received before the first signal is received from the upstream sampled analog circuit.

20 Claims, 5 Drawing Sheets

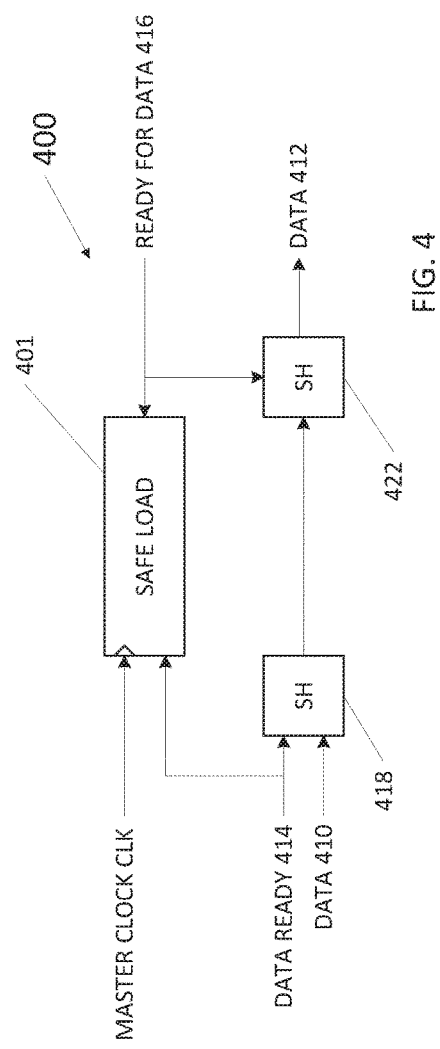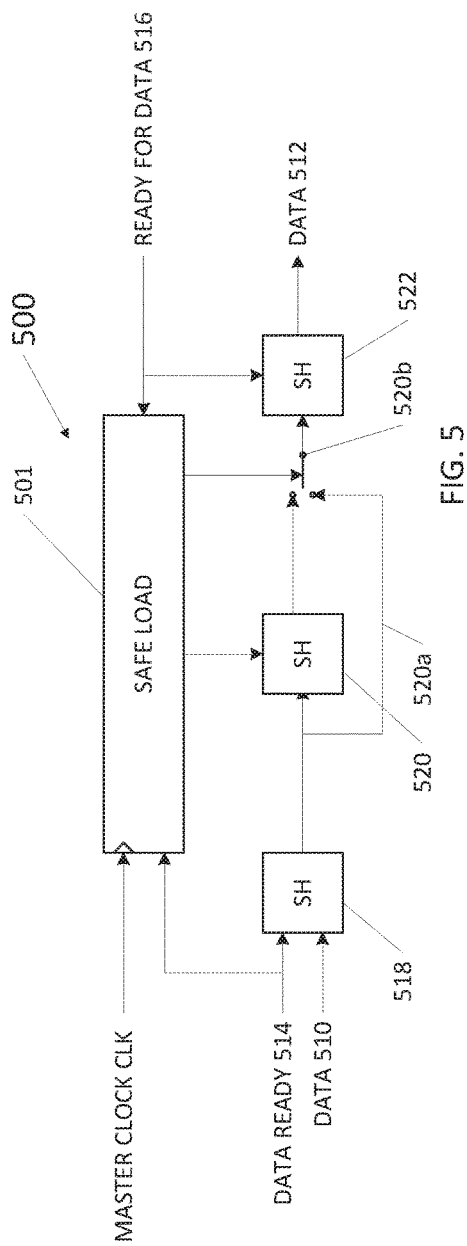

US 9,917,684 B1

SYSTEM AND METHOD FOR SAMPLED ANALOG CLOCK DISTRIBUTION

FIELD OF THE DISCLOSURE

A system and method for sampled analog clock distribution is described, in particular for larger systems-on-chip (SoC) which require precise alignment of phase clocks of different analog circuits.

BACKGROUND

In large sampled analog systems, continuous analog signals are sampled at discrete intervals, which is be carefully chosen to ensure an accurate representation of the original analog signal. For example, prior to an analog-to-digital conversion, the analog signals may pass through some sort of signal conditioning circuitry which performs such functions as amplification, and attenuation, or filtering. If the analog signal originates, for example, as a temperature, pressure, flow rate or the like, then an appropriate sensor and transducer is required to first convert the physical quantity into an electrical voltage or current. A sampled analog circuit performs its calculations over a number of compute phases, with each phase executing a specific function, such as multiplication and addition. Multiple parallel systems may be used to concurrently sample input data and/or recombine their outputs to one or more post-processing circuits.

The phases of the sampled analog circuits on a chip must be synchronized, i.e. aligned, to enable the various analog circuits to cooperate reliably. Running all the analog circuits off a common master clock is difficult, in particular when the circuits and/or the chip have a large size, and even distributing the clock signal requires a not insignificant amount of power.

It would therefore be desirable and advantageous to obviate shortcomings and to provide an improved system and method for sampled analog clock distribution across large area chips, wherein the phases of different sampled analog circuits can be aligned precisely without requiring distribution of precisely clock aligned global clock pulses to and between the different analog circuits, while simultaneously significantly reducing the power demand of the SoC device.

SUMMARY OF THE DISCLOSURE

Sampled analog data are transferred between sampled analog circuits operating on respective local phase clocks which are triggered by a master clock. In response to a DATA READY signal from an upstream sampled analog circuit, the sampled analog data are transferred from an upstream sampled analog circuit to a data transfer circuit. In response to a READY FOR DATA signal from a downstream sampled analog circuit, the sampled data are transferred from the data transfer circuit to the downstream sampled analog circuit. The sampled data are delayed in the data transfer circuit for at least one master clock cycle when the READY FOR DATA signal from the downstream sampled analog circuit is received before the DATA READY is received from the upstream sampled analog circuit.

In certain embodiments, at least one global master clock is generated which is distributed to each sampled analog circuit. The sampled analog circuits then generate their own phase clocks locally. Sampled analog data are processed in a source sampled analog circuit under control of its local phase clock and a DATA READY signal is provided when processing is concluded. The data are transferred to a destination sampled analog circuit, which also has its own local phase clock, under control of a mixed signal sub-circuit (data transfer circuit) which controls the transaction of data between the source and destination sampled analog circuits by preventing temporal overlap between the source and destination data. To this end, the data transfer circuit may delay the data from the source sampled analog circuit by an extra sampling period in order to maintain constant system latency.

BRIEF DESCRIPTION OF THE DRAWINGS

Other features and advantages of the present disclosure will be more readily apparent upon reading the following description of exemplified embodiments of the disclosure with reference to the accompanying drawing, in which:

FIG. 4 shows an exemplary mixed signal sub-circuit according to an embodiment of the present disclosure that handles data transfer between sampled analog sub-circuits running on different locally generated phase clocks;

FIG. 5 shows an exemplary mixed signal sub-circuit with an additional bypassable sample and hold circuit according to an embodiment of the present disclosure;

DETAILED DESCRIPTION

A SoC (system-on-chip) sampled analog system performs operations, such as charging/discharging capacitors, addition, multiplication, etc., typically in circuits that can be located remote from one another on the chip. These circuits run either on a master clock or on phase clocks that need to be aligned before data can be transferred between circuits or forwarded to downstream circuits for further processing. Distributing the master clock or precisely aligning the various phase clocks is not only difficult at high clock rates, but also consumes a substantial amount of power, in addition to the power required for the actual computations, which is detrimental for the overall performance of the SoC system. According to the present disclosure, this problem is addressed by providing each circuit with a free-running phase clock that may be triggered by the master clock and by managing the data transfer between the circuits in a decentralized fashion.

Figure 1:
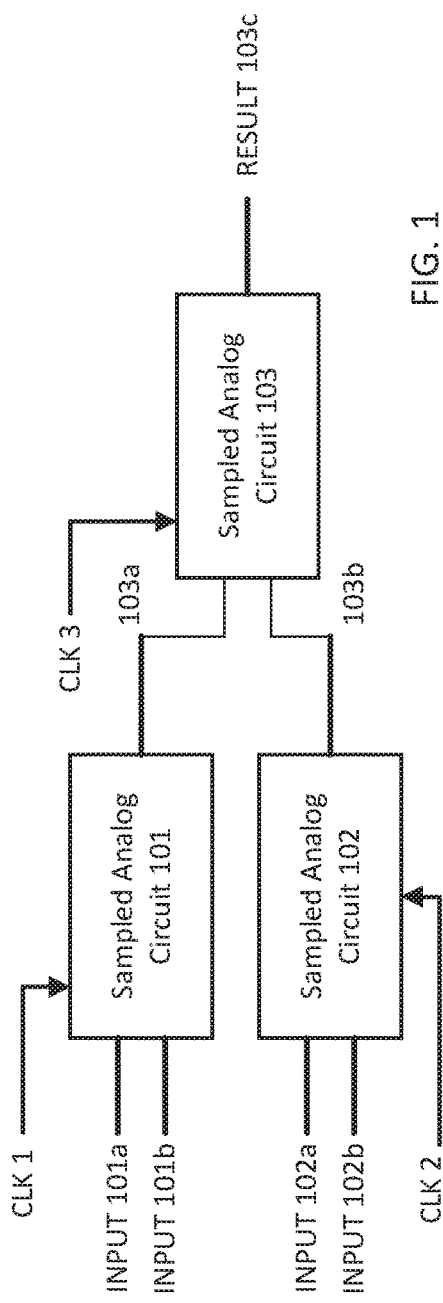
FIG. 1 shows schematically an exemplary embodiment of a SoC sampled analog system.

Turning now to the drawing, and in particular to FIG. 1, there is shown in form of a schematic diagram an exemplary embodiment of a SoC (system-on-chip) sampled analog system. The exemplary SoC system includes three sampled analog circuits 101, 102, 103 which may receive respective clock signals CLK1, CLK2, CLK3 which in one implementation may be derived from a common global phase clock.

Each sampled analog circuit may receive at respective inputs 101*a*, 101*b*; 102*a*, 102*b*; 103*a*, 103*b* sampled analog input signals. Each sampled analog circuit 101, 102, 103 may receive more than the indicated two input signals. In the depicted exemplary embodiment, each of the sampled analog circuits 101, 102, 103 may process the signals received at the respective inputs 101*a*, 101*b*; 102*a*, 102*b*; 103*a*, 103*b* and output the processed signals to a downstream sampled analog circuit which may also be an analog-to-digital (A/D) converter. For example, inputs 103*a*, 103*b* of the sampled analog circuit 103 receives the processed signals from respective outputs of the sampled analog circuits 101, 102.

Figure 2:
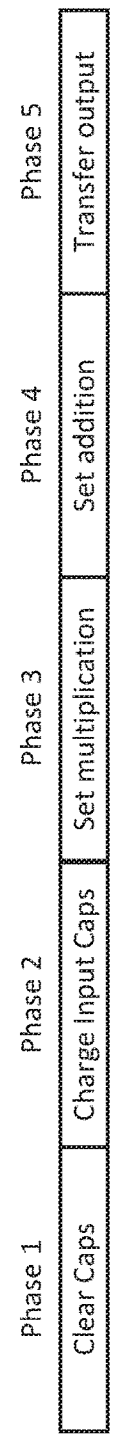
FIG. 2 shows exemplary functions performed during five exemplary phases of a SoC sampled analog circuit of FIG. 1.

The sampled analog circuits 101, 102, 103 typically include switched capacitors (CAP) which are first discharged before accepting new input data and then charged commensurate with an applied voltage. As shown in FIG. 2, each of the sampled analog circuits 101, 102, 103 may then perform a number of operations, such as multiplication and addition, by executing a plurality of discrete phases, with five exemplary phases Phase 1, Phase 2 . . . Phase 5 shown in FIG. 2.

For example, in Phase 1 all sample and hold capacitors (CAPS) may be cleared, i.e. discharged. In Phase 2, the input CAPS may be charged commensurate with an applied voltage; in Phase 3, a first operation such as a multiplication may be executed; in Phase 4, a second operation such as addition may be executed; and in Phase 5, the output may be transferred to, for example, another downstream sampled analog circuit, for example the sampled analog circuit 103 in FIG. 1. It will be understood that the sampled analog circuit may have more or less than the exemplary five phases, for example 2 phases, 3 phases, 4 phases or more than 5 phases, depending on the number of operations to be performed.

The timing of the various phases in the various sampled analog circuits must be synchronized in particular when data are transferred between the various sampled analog circuits. For example, output data from sampled analog circuit 101 must only be transferred to the input 103*a* of the sampled analog circuit 103 when the sampled analog circuit 103 is ready to accept the data. The same applies to data transfer between the sampled analog circuit 102 and the sampled analog circuit 103 and/or to any other sampled analog circuit connected for data transmission to another downstream sampled analog circuit. As mentioned above, it is typically difficult and therefore disadvantageous to run the various sampled analog circuits off a common master clock, especially when the master clock pulses are distributed across a large chip or even across multiple chips due to propagation delays that are difficult to predict and manage.

Clock delays in the system due to the effective length (capacitance to ground, physical length) of the clock distribution lines and the delay caused by the clock generation circuitry (flip-flop) make accurate alignment of the master clock pulses across a large chip, to say the least, difficult. For example, in a chip produced with 18 nm process technology, 50% of the overall delay may be due to switching delays and 50% due to the transmission delay. Conversely, in a chip produced with 28 nm process technology, 10% of the overall delay may be due to the switching delay and 90% due to the transmission delay and on the wire.

Another aspect of the present disclosure is to reduce the overall power consumption of the SoC chip. Distributing a precisely aligned global or master clock to all sampled analog devices on a chip can disadvantageously consume just for the clock distribution across the chip up to 90% of the power demand of the chip which is disadvantageous when a long battery life is required, for example in hearing aids. Moreover, SoC devices may have chips with an area of 30-40 mm$^2$, power consumption and heat dissipation may become a significant problem.

For this reason, according to one embodiment of the present disclosure, the various sampled analog circuits, such as the sampled analog circuits 101, 102, 103 may advantageous be operated with their own dedicated local phase clocks, indicated in FIG. 1 by the respective clock signals CLK1, CLK2 and CLK3. The clock rates of the local phase clocks may be different from each other and from the clock rate of the master clock. An important detail is that the high/active period of any given phase clock must not overlap with any of the other phase clocks. Further the high/active period should be as long as possible to provide as much time for the switch CAP circuit to acquire/move charge.

For example, in one embodiment, the sampled analog circuit 101 may process the high 8 bits of a 16-bit signal, whereas the sampled analog circuit 102 may process the low 8 bits of the 16-bit signal, in which case, for example, the sampled analog data may be applied to inputs 101*a* and 102*a*, whereas the binary filter coefficients may be applied to inputs 101*b* and 102*b*. The signals at the outputs of sampled analog circuits 101, 102 must then be temporally realigned before being combined in the sampled analog circuit 103.

As described above with reference to FIG. 1 and FIG. 2, each of the sampled analog circuits 101, 102, 103 may process the data at a respective local phase clock rate. The challenge is hereby to ascertain that, although the local phase clock rates may be different between the various sampled analog circuits, an upstream sampled analog circuit (e.g. 101 or 102) transmits data to a respective downstream sampled analog circuit (e.g. 103) only when the downstream sampled analog circuit is ready to accept the data, for example after the downstream sampled analog circuit has transferred its processed data as result 103*c* to an (unillustrated) further circuit.

One solution to this problem would be, for example, to perfectly align the various phase clocks at each instant of time or to provide a fixed time offset between the various phase clocks. Since aligning or maintaining alignment between the different phase clocks is difficult, the challenge becomes then to safely transfer the data from, for example, sampled analog circuit 101 to the sampled analog circuit 103 and/or from the sampled analog circuit 102 to the sampled analog circuit 103 with "loosely" aligned local phase clocks. Care must be taken that data are transferred from the respective sampled analog circuits 101, 102 to the sampled analog circuit 103 only when the sampled analog circuit 103 is ready to accept these data, i.e. it must be ensured that the local phase clocks of sampled analog circuits 101, 102 do not overlap with the local phase clock of sampled analog circuit 103.

Figure 3:
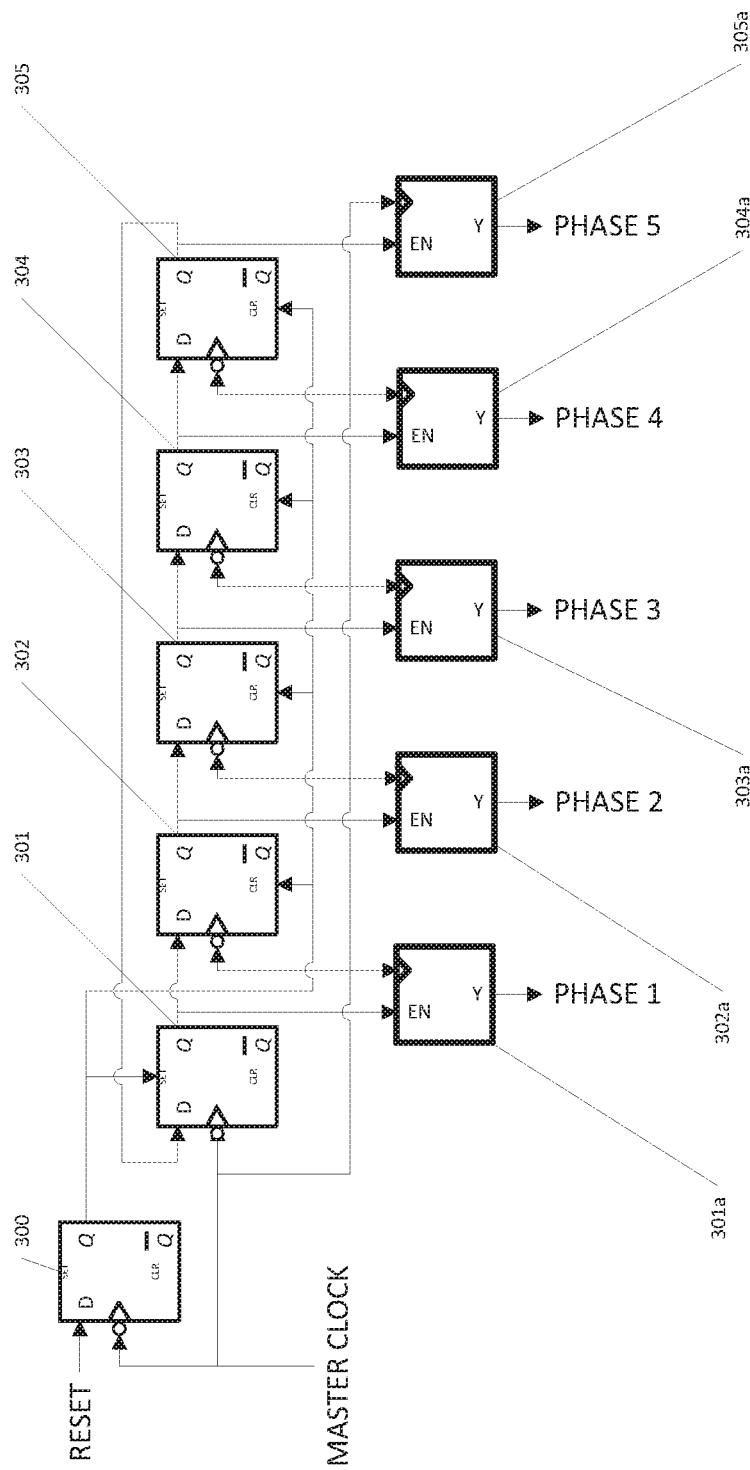
FIG. 3 shows an exemplary local phase clock generator used in a sampled analog circuit of FIG. 1.

In accordance with an embodiment of the present disclosure, the local phase clocks may be generated with, for example, a circuit of the type shown in FIG. 3 in each sampled analog circuit.

The exemplary phase clock generator depicted in FIG. 3 is constructed as a shift register that shifts a '1' around in a circular loop. The '1' is used to control the enable input of a series of clock gating cells. The output of the clock gating cells is a non-overlapping phase clock between all phases, in the exemplary circuit illustrated in FIG. 3 the phases 1, 2, . . . , 5, which control the operations of the sampled analog circuits shown in FIG. 3. As mentioned above, the circuit of FIG. 3 may have more or fewer than 5 phases, commensurate with the number of operations (or phases) performed by the sampled analog circuits 101, 102, 103. It should be noted that the shift register is running of the falling edge of the master clock to ensure that the clock gate enable changes when the master clock is low. Using the falling edge allows using a simple AND gate for the clock gating cell. It should also be noted that the duty cycle of the master clock determines the high/active period of a given phase. The high/active period may for example be 50/50, but may be also be adjusted to, for example, 90/10 to extend the active period for as long as possible. The only requirement is that the shift register flops need enough of a low period to be able to shift data from D to Q. As will be described below in more detail, the clock rate of the local phase clocks of the various sampled analog circuits is higher than the clock rate of the master clock by at least a factor corresponding to the number of phases processed in the various sampled analog circuits.

In an alternative embodiment (not shown), the phase clocks may also be generated by a set of delay lines.

According to an advantageous exemplary embodiment of the present disclosure schematically illustrated in FIGS. 4 and 5, data can be safely transferred between different sampled analog circuits, such as circuits 101 and 103, and 102 and 103, respectively, in spite of the lack of precisely synchronized and temporally phase-aligned local phase clocks, even when dealing with large area SoC circuits, by employing a so-called data transfer circuit 400, 500 with a "safe load" block 401, 501, respectively. Describing first the exemplary embodiment illustrated in FIG. 4, the data transfer circuit 400 is composed of Sample Hold [SH] blocks 418, 422, which function as a kind of analog latch circuit. The Sample Hold blocks 418, 422 operate from left to right by: (1) upon receipt of a "data ready" signal 414 from a source-sampled analog circuit, such as the sampled analog circuit 101 of FIG. 1, capturing with Sample Hold block 418 the incoming sampled analog data 410 from the source-sampled analog circuit; (2) transferring the data from Sample Hold block 418 to Sample Hold block 422 and holding the sampled analog data in Sample Hold block 422, thus preventing the data from changing while the destination sampled analog circuit, such as the sampled analog circuit 103 of FIG. 1, is still processing data; and (3) upon receipt of a "ready for data" signal 416 from the destination sampled analog circuit, indicating that the destination sampled analog circuit is ready to accept the data 412, transferring the data from Sample Hold block 422 to the destination sampled analog circuit. Stated differently, data ready to be transferred from, for example, sampled analog circuit 101 or 102 in FIG. 1 are transferred to sampled analog circuit 103 only when circuit 103 is ready to accept the data 412.

The "safe load" block 401 may be triggered by the master clock or by one of the local clocks of the sampled analog circuits 101, 102, 103. It should be kept in mind that the "data ready" signal 414 and the "ready for data" signal 416 supplied to the safe load block 401 and the respective Sample Hold blocks 418 and 422 are not provided by any predetermined clock cycle, but instead by the state of the respective sampled analog circuits 101, 102, 103 from, to or between which the analog data are to be transferred.

Using the above data transfer circuit and assuming that the sampled analog blocks all operate at the same over-all sampling rate, sequences of sampled analog circuits that have neither aligned local phase clocks nor an aligned master clock can now be "stitched" together.

For the above-described data transfer block 400, one of two situations can occur. 1) The source and destination blocks are so far out of phase that the safe load circuit will load data between the "data ready" and the "ready for data" strobes. In this situation, the data handover block will have an intrinsic delay of 0 sample times in the system. 2) The source and destination blocks are almost in phase, which prompts the safe load circuit to load data after the "ready for data" strobe. In this situation, the system has a delay of one sample time.

To prevent this situation from adversely affecting the data transfer, a third Sample/Hold [SH] block 520 with an optional bypass 520a may be added in data transfer circuit 500, as depicted in FIG. 5. The data transfer circuit 500 has once more a "safe load" block 501 and is composed of a number of Sample Hold [SH] blocks 518, 522, with the third SH block 520 being interposed between the Sample Hold [SH] blocks 518, 522. A switch 520b is controlled by the safe load circuit 501 to either bypass the SH block 520 via the bypass line 520a or to add a delay of "1" with SH block 520. In this embodiment, the delay of "1" guarantees that the delay in the system throughout the transfer of data 610, 612 between the sampled analog circuits 101, 102, 103 is always equal to one sample time, wherein sample time refers to the time required by a respective sampled analog circuit 101, 102, 103 to process all the exemplary phases Phase 1, . . . Phase 5 shown in FIG. 2. Depending on the system delay, more than one bypassable SH block 520 may be required for properly aligning the phases between the different sampled analog circuits. Also, the sampled analog circuits between which data are being transferred may be located on different chips which may introduce additional delays. The "data ready" and the "ready for data" signals may be generated by the local phase clocks of the respective sampled analog circuits.

In an alternative unillustrated embodiment, the internal phase clocks may be started at different times to guarantee that any data transaction between the sampled analog circuits is precisely aligned.

Figure 6A:
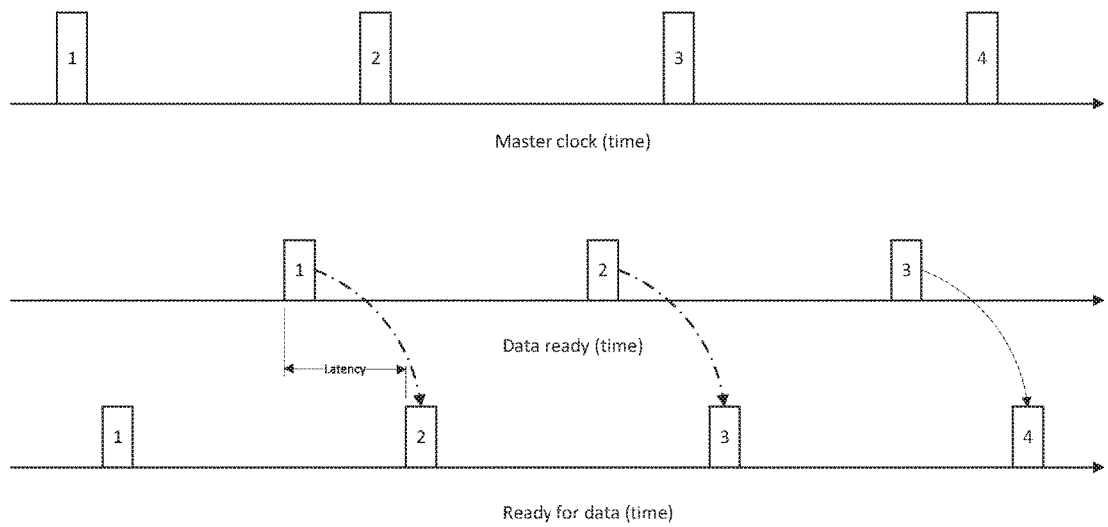
FIG. 6A shows a first exemplary pulse sequence of master clock, data ready and ready for data without an added delay.

The switching of the bypassable SH block 520 will now be explained with reference to FIGS. 6A and 6B. The set of operations defined by the exemplary phases Phase 1, Phase 2, . . . Phase 5 in FIG. 2 are performed in the various exemplary sampled analog circuits 101,102, 103 at each clock cycle of the master clock under control of the local phase clocks. Let's assume in a first situation depicted in FIG. 6A, that the first set of operations is initiated by master clock pulse "1". When the operations are completed, the safe load circuit has to wait for the next "ready for data" pulse "2". Note that since the clock pulses are cyclic, there is no actual distinction between the differently numbered clock pulses. The data are then transferred to the next sampled analog circuit 103 at the "ready for data" pulse "2" with an implied delay of "1", also referred to a latency. In this situation, the SH block 520 is bypassed and no additional delay is introduced.

Figure 6B:
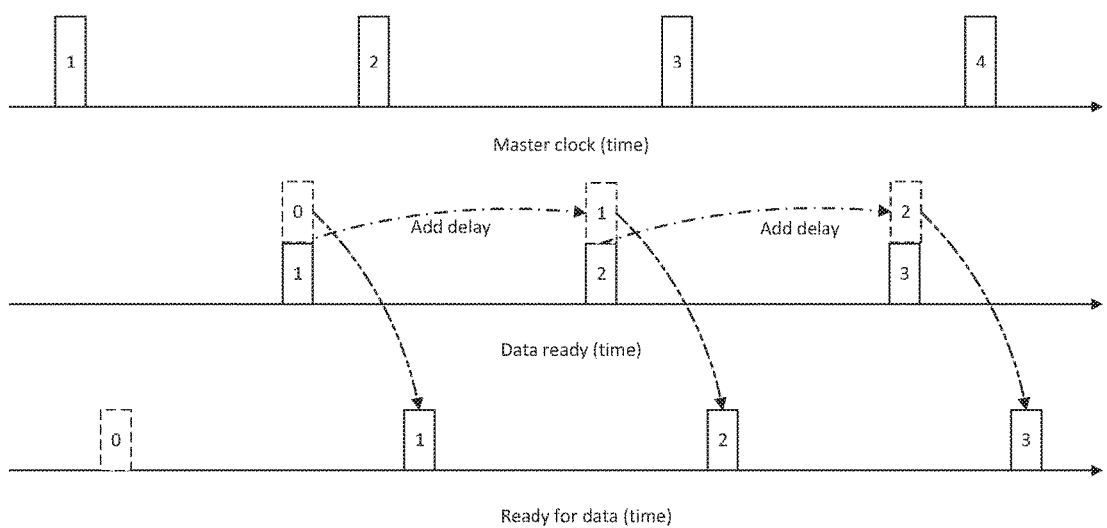
FIG. 6B shows a second exemplary pulse sequence of master clock, data ready and ready for data with an added delay of one cock cycle.

Conversely, as shown in FIG. 6B, when the data 510 are ready at the input of SH block 518, a "data ready" pulse "1" is sent to safe load block 501, but the downstream circuit is not yet ready to receive the data. In this situation, a delay of one sample, as indicated by the dashed arrow, may be added to the data 510 by SH block 520 so that when a "ready for data" pulse "2" is received by the safe load block during the next master clock cycle, the data can be safely transferred with a delay of once more "1". In this way, the phases are aligned in the same manner as in FIG. 6A and the system delay is always equal to "1".

With the approach according to the disclosure described above, one or more "sloppy" master clocks and local phase clocks can be used in every sampled analog circuit 101, 102, 103, wherein the data are then aligned by the data transfer circuit 400, 500 under control of the "safe load" block 401,

501. The "safe load" block 401, 501 can be implemented as a counter, for example as a four bit counter with eight clock pulses, wherein the first counter increments by up to four bits from receipt of a start pulse or "data ready" signal 414, 514 until either the maximum count is attained or a "ready for data" signal 416, 516 is received from, for example, an upstream sampled analog circuit 101, 102, and the second counter increments by up to four bits from receiving the "ready for data" signal 416, 516 from, for example, a downstream sampled analog circuit 103 until either the maximum count is attained or a new "data ready" signal 414, 514 is received.

The clock management according to the present disclosure also operates when the sampled analog circuits, 102, 103 have a mutually different number of phases. For example, sampled analog circuit 101 may have only two phases, whereas sampled analog circuit 103 as well as sampled analog circuit 102 may each have more than two, for example five phases. In practice, each of the sampled analog circuits 101, 102, 103 may have any number of phases. The local phase clock rate (or phase clock frequency) may be an integer multiple of the master clock rate, which may run at a frequency of, for example, 40 to 80 MHz. The data transfer circuits 400, 500 of FIGS. 4 and 5 still phase-align the sampled analog circuits 101 and 103 with the same system delay in spite of different clock rates of the sampled analog systems.

Figure 7:
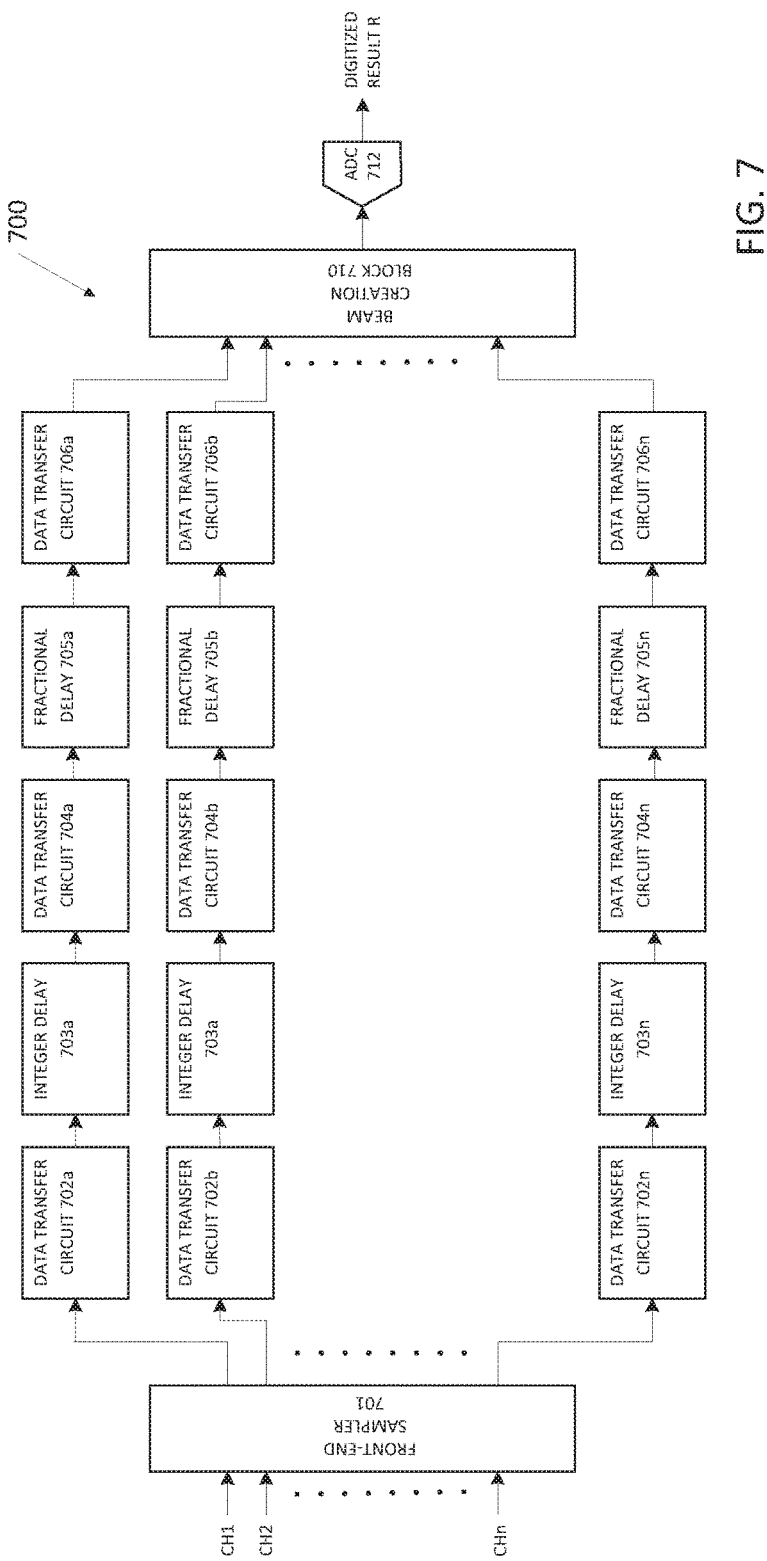
FIG. 7 shows an SoC multi-channel sampled analog ultrasound beam former in which the local phase clock distribution according to the present disclosure can be implemented.

FIG. 7 shows a schematic diagram of a sampled analog ultrasound SoC beamformer 700 which is configured to incorporate the sampled analog clock distribution according to the present disclosure. A system and method for ultrasound beamforming with an analog beamformer is described, for example, in published US patent application 2016/0097846, the contents of which is incorporated herein in its entirety by reference.

To create or form an ultrasound beam, the target output waveform is delayed to produce a focused sound beam at the transducer array that can target a particular area of interest. For the beamformer described in US patent application 2016/0097846, a beamformer central control processor generates a number of digital signals, which are converted into analog signals which are then transmitted to the beamformer, which performs sampled analog beamforming, and transmits the signal to a HV amplifier. The sampled analog beamformer expands one or more channels into a larger number of integrally or fractionally delayed channels. The fractional delays US patent application 2016/0097846 are implemented using Farrow filters, which are known in the art.

According to an embodiment of the present disclosure, a sampled analog beamformer uses the sampled analog clock distribution for managing/aligning the phase relationships between different delay circuits within a channel and between channels of the ultrasound beamformer.

The exemplary ultrasound SoC beamformer 700 may have a front end sampler 701 receiving a plurality of n input channels CH1, CH2, . . . CHn, wherein n may be any integer, preferably a multiple of 2, for example 128 channels. The phases at the respective outputs of the front end sampler 701 are assumed to be precisely aligned. The respective outputs of the front end sampler 701 may then each be processed in parallel by a plurality of sequentially arranged respective integer delay blocks 703*a*, 703*b*, . . . 703*n* and fractional delay blocks 705*a*, 705*b*, . . . 705*n*. Only two delay blocks are shown for each channel. Each of the delay blocks 703*a*, 703*b*, . . . 703*n*; 705*a*, 705*b*, . . . 705*n* may perform operations controlled by local phase clocks similar to those described above with reference to the sampled analog circuits 101, 102, 103 of FIG. 1. The phases between these local phase clocks must be aligned such that data are transferred to a subsequent delay block or to the beam creation block 710 only when the data are ready and the subsequent delay block or the beam creation block is ready to receive the data.

This function is performed by the data transfer circuits 702*a*, 702*b*, . . . 702*n*; 704*a*, 704*b*, . . . 704*n* and 706*a*, 706*b*, . . . 706*n*, which may be constructed like the data transfer circuits 400 and 500, respectively, shown in FIGS. 4 and 5. The data transfer circuits may be inserted for phase alignment between the various integer and fractional delay blocks before the suitably delayed data are combined in beam creation block 710 into an analog output signal which may then optionally be digitized in an A/D converter 712 to provide a digitized result for further processing. It is important that the phase relationship between the output signals at the front end sampler 701 is reproduced at the input of the beam creation block 710. To this end, each of the delay blocks may be connected to a master clock, but importantly may also generate its internal phase clock, as described above. Analog delay lines used in other approaches or digital delay lines described, for example, in US patent application 2016/0097846 are advantageously replaced by the integer and fractional delay blocks 703*a*, 703*b*, . . . 703*n* and 705*a*, 705*b*, . . . 705*n*, respectively, which operate in the analog domain. A typical ultrasound SoC system may have 128 or more input channels and a chip size of several 10 mm$^2$. Distributing the clock signal from a master clock can easily consume 90% or more of the overall power consumption of the chip, whereas the SoC system with distributed phase clocks consumes only approximately several nA to pA per MHz.

The electrical circuits illustrated the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SoC) package, either in part, or in whole. A SoC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It should be noted that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

In certain contexts, the features discussed herein can be applicable to medical systems, scientific instrumentation, wireless and wired communications, radar, industrial process control, audio and video equipment, current sensing, instrumentation (which can be highly precise), and other analog-processing-based systems. Moreover, certain embodiments discussed above can be provisioned in analog signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications may include advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

It should also be noted that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures, illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A method for transferring sampled analog data between sampled analog circuits operating on respective local phase clocks, comprising:
   in response to a first signal from an upstream sampled analog circuit, transferring the sampled analog data from the upstream sampled analog circuit to a data transfer circuit; and
   in response to a second signal from a downstream sampled analog circuit, transferring the sampled analog data from the data transfer circuit to the downstream sampled analog circuit.

2. The method of claim 1, wherein the first signal indicates that the upstream sampled analog circuit is ready to supply the sampled analog data to the data transfer circuit, and the second signal indicates that the downstream sampled analog circuit is ready to accept the sampled analog data from the data transfer circuit.

3. The method of claim 1, wherein the data transfer circuit comprises at least one sample hold (SH) block.

4. The method of claim 1, wherein the sampled analog data are sampled at a master clock rate.

5. The method of claim 1, further comprising delaying the transferred sampled analog data between the upstream sampled analog circuit and the downstream sampled analog circuit by one master clock cycle.

6. The method of claim 1, further comprising delaying the sampled analog data in the data transfer circuit for at least one additional master clock cycle when the second signal from the downstream sampled analog circuit is received before the first signal is received from the upstream sampled analog circuit.

7. The method of claim 1, wherein the respective local phase clocks run at a frequency that enables the sampled analog circuits to perform all phases of a computation within one master clock cycle.

8. The method of claim 1, wherein the respective local phase clocks are triggered by a trigger signal from a master clock.

9. The method of claim 1, wherein the respective local phase clocks operate at different clock frequencies.

10. A system for transfer of sampled analog data, comprising:
consecutively arranged sampled analog circuits operated by respective local phase clocks which are triggered by a master clock, the local phase clocks controlling execution of operations in the analog sampled circuits, and
a data transfer circuit comprising at least one sample/hold (SH) block receiving sampled analog data from an upstream sampled analog circuit, and a safe load block receiving a first signal from the upstream sampled analog circuit, wherein the at least one SH block transfers the sampled analog data to a downstream sampled analog circuit, in response to a second signal from the downstream sampled analog circuit.

11. The system of claim 10, wherein the second signal indicates that the downstream sampled analog circuit is ready to accept the sampled analog data outputted by the at least one SH block.

12. The system of claim 10, wherein the sampled analog data are sampled at a master clock rate.

13. The system of claim 10, wherein the data transfer circuit further comprises at least one bypassable SH block configured to delay the sampled analog data received from the upstream sampled analog circuit, when the second signal is received from the downstream sampled analog circuit before the first signal is received from the upstream sampled analog circuit.

14. The system of claim 13, wherein the at least one bypassable SH block delays the sampled analog data by at least one clock cycle of the master clock.

15. The system of claim 10, wherein the respective local phase clocks run at a frequency that enables the sampled analog circuits to perform all phases of a computation within one clock cycle of the master clock.

16. The system of claim 10, wherein the respective local phase clocks run at different frequencies.

17. A system for transferring sampled analog data between sampled analog circuits operating on respective local phase clocks, comprising:
first means for transferring sampled analog data from an upstream sampled analog circuit to a data transfer circuit in response to receipt of a first signal indicating that the sampled analog data are ready to be transferred, and
second means for transferring the sampled analog data from the data transfer circuit to a downstream sampled analog circuit upon receipt of a second signal indicating that the downstream sampled analog circuit is ready to accept the transferred sampled analog data.

18. The system of claim 17, further comprising means for delaying the sampled data for at least one master clock cycle when the second signal from the downstream sampled analog circuit is received before the first signal is received from the upstream sampled analog circuit.

19. The system of claim 17, wherein the local phase clocks run at different frequencies.

20. The system of claim 17, wherein the local phase clocks are triggered by a trigger signal from a master clock.

* * * * *